United States Patent [19]
Jensen et al.

[11] Patent Number: 5,862,560
[45] Date of Patent: Jan. 26, 1999

[54] ROLLER WITH TREADING AND SYSTEM INCLUDING THE SAME

[75] Inventors: Alan J. Jensen, Troutdale, Oreg.; Norman A. Mertke, Morgan Hill, Calif.; William Dyson, Jr.; Lynn Ryle, both of San Jose, Calif.; Patrick Paino, Otisville, N.Y.

[73] Assignee: Ontrak Systems, Inc., Milpitas, Calif.

[21] Appl. No.: 705,337

[22] Filed: Aug. 29, 1996

[51] Int. Cl.$^6$ .............................. B08B 3/02; B08B 1/04; B08B 11/00
[52] U.S. Cl. .............................. 15/77; 15/88.3; 134/902; 492/27; 492/30
[58] Field of Search ............................. 15/77, 88.1, 88.2, 15/88.3; 134/153, 902; 492/27, 28, 30, 31, 33, 36

[56] References Cited

U.S. PATENT DOCUMENTS

| | | | |
|---|---|---|---|
| 2,335,594 | 11/1943 | Kerr | 492/27 X |
| 2,646,612 | 7/1953 | Shearer | 492/33 |
| 2,857,605 | 10/1958 | Weishaar | 134/153 X |
| 3,327,721 | 6/1967 | Carlson | 134/153 X |
| 3,599,306 | 8/1971 | Bradford | 492/30 |
| 3,937,919 | 2/1976 | Clerx et al. | 219/216 |
| 4,202,071 | 5/1980 | Scharpf | 134/153 X |
| 4,483,434 | 11/1984 | Miwa et al. | 198/394 |
| 4,705,711 | 11/1987 | Perna | 428/141 |
| 4,826,071 | 5/1989 | Becker | 228/160 |
| 5,028,200 | 7/1991 | Shimane | 414/757 |
| 5,129,876 | 7/1992 | Branbant et al. | 493/471 |
| 5,183,378 | 2/1993 | Ansno et al. | 414/757 |
| 5,188,273 | 2/1993 | Schmoock | 226/190 |
| 5,391,135 | 2/1995 | Kuroki et al. | 492/35 |
| 5,475,889 | 12/1995 | Thrasher et al. | 15/88.3 |
| 5,533,243 | 7/1996 | Asano | 29/25.01 |
| 5,566,466 | 10/1996 | Hearne | 34/58 |

FOREIGN PATENT DOCUMENTS 60-143634  7/1985  Japan ........................................ 15/77

*Primary Examiner*—Mark Spisich
*Attorney, Agent, or Firm*—Blakely, Sokoloff, Taylor & Zafman LLP

[57] ABSTRACT

A method and apparatus for rotating wafers in a double sided scrubber where a rotating roller imparts rotary motion to a semiconductor wafer during a double sided cleaning process. The rotating roller and wafer contact at their outer edges and the friction between their outer edges causes the wafer to rotate. The roller has an outer edge with a groove in which the wafer edge is pinched. Treads or grooves extending from the groove channel liquids away from the groove to prevent wafer slippage when rotating and cleaning solutions are applied to the wafer.

18 Claims, 9 Drawing Sheets

ROLLER WITH TREADING AND SYSTEM INCLUDING THE SAME

FIELD OF THE INVENTION

The present invention relates to semiconductor wafer processing, specifically the cleaning process of a semiconductor wafer.

BACKGROUND OF THE INVENTION

In the manufacture of semiconductor devices, the surface of semiconductor wafers must be cleaned of wafer contaminants. If not removed, wafer contaminants may affect device performance characteristics and may cause device failure to occur at faster rates than usual.

One system used to remove wafer contaminants is commonly referred to as a scrubber. In at least one type of scrubber, a semiconductor wafer is scrubbed simultaneously on both sides by brushes. While the wafer is being scrubbed simultaneously on both sides by the brushes, the wafer is held in place and rotated so that the entire surface of the wafer is cleaned. Rollers may be used for this purpose.

Scrubbers usually comprise a conveyor type mechanism, rollers, and brushes. In general, the wafer lies flat on the conveyor mechanism and the conveyor mechanism moves the wafer into the brushes. While being scrubbed, the wafer is supported (or held horizontally) by the conveyor mechanism, brushes, rollers, or a combination thereof. In one prior art type of scrubber, as the wafer is being scrubbed by the brushes, the roller rotates the wafer so that the entire wafer surface may be cleaned. The roller itself is being rotated about its central axis by a motor. The rotary motion of the roller is transferred to the wafer when the edge of the roller comes into contact with the outer edge of the wafer.

FIG. 1 illustrates a prior art roller. Referring to FIG. 1, the top and bottom surfaces 110 and 120 of the roller 100 are generally flat and the outer edge 130 of the roller 100 has a slight concave indentation (concave outer edge). As is shown in FIG. 1, the concave outer edge of the roller 100 contacts the outer edge of the wafer 150. When the roller 100 and wafer 150 contact each other, friction between the edges is created, so that the rotation of the roller 100 causes the wafer 150 to rotate. As shown in FIG. 1, the wafer 150 and roller 100 are in essentially single point contact.

One problem with this prior art roller is that the roller/wafer contact may be insufficient, so that the wafer hesitates, i.e. fails to rotate. If the wafer fails to rotate during the scrub operation, some areas of the wafer will not be scrubbed, so that the wafer is not cleaned to the desired level. An additional problem which may occur is that if the system relies on the roller to rotate the flat into a predetermined position for the next operation, the wafer flat may be misplaced. For example, after the scrub operation, the wafer may next go to a spin dry operation where it is held by its edges. If the wafer flat is misplaced, the wafer may not be held properly.

FIG. 2 illustrates another prior art roller that compensates for insufficient contact. Referring to FIG. 2, the roller 200 includes top and bottom surfaces (201, 202) which are generally flat, slightly indented portions 203 and 204, and an inner groove (groove) 210. When a wafer, such as wafer 250, is being cleaned between brushes, it is pushed forward and inserted into the groove 210 of the roller 200 to a point where the groove 210 pinches the wafer 250 causing increased contact, and therefore, increased friction between the roller 200 and the edge of the wafer 250. Thus, when the roller 200 is rotated the friction causes the wafer 250 to rotate.

However, even though prior art rollers provide a mechanism to pinch a wafer, slippage between the wafer and the roller can still occur when cleaning solutions, such as ammonium hydroxide ($NH_4OH$) and/or water, are used in the cleaning process. The $NH_4OH$ or other cleaning solution acts as a lubricant between the outer edge of the wafer and the outer edge of the roller, reducing the friction between the edges when they contact and causing slippage. It is desirable to reduce the slippage that may occur between a wafer and a roller when solutions are used in the cleaning process.

The treads allow better contact between wafer edge and roller as well as allow channels for fluid to drain through. (This is as important as the flow of fluids).

Another problem that occurs when scrubbing both sides of a wafer at the same time is that the points of contact between the brushes and the wafer may not be aligned vertically. During the scrubbing process, the application of the brushes results in pressure being applied to the wafer at their point of contact. When these points of contact are not aligned vertically, the wafer may be tilted from its horizontal position due to pressure being applied on the wafer by one or both of the brushes. The tilting of the wafer may cause the wafer to be displaced from the roller(s), and even shoot over the roller(s). It is desirable to maintain wafer contact with the roller during the scrubbing process when points of contact between the brushes and the wafer are not vertically aligned.

What is needed is a method and apparatus for rotating wafers in a scrubber with reduced or eliminated slippage, particularly when cleaning solutions are being used.

SUMMARY OF THE INVENTION

The present invention describes a roller having adjacent first and second side portions, with a groove there between. Treads extending between the groove and an outer edge of at least one of the side portions are used to channel solutions away from the groove.

In one embodiment, the roller has a groove which contacts the substrate and one or more treads channeling solutions from the groove, thereby ensuring better contact between a substrate and the roller to facilitate the imparting of rotation motion to the substrate.

In one embodiment, both side portions are conic shaped about a central axis with an increasing diameter from the groove to their outer edges. The outer edge of one of the side portions has a greater diameter than that of the other side portion.

Additional features and benefits of the present invention will become apparent from the detailed description, figures, and claims set forth below.

BRIEF DESCRIPTION OF THE DRAWINGS

The present invention will be understood more fully from the detailed description given below and from the accompanying drawings of various embodiments of the invention, which, however, should not be taken to limit the invention to the specific embodiments, but are for explanation and understanding only.

DETAILED DESCRIPTION

A roller for use in a processing system is disclosed. In the following description, numerous specific details are set forth such as specific materials, configurations, dimensions, etc., in order to provide a thorough understanding of the present invention. It will be apparent, however, to one skilled in the art that these specific details need not be employed to practice the present invention. In other instances, well known materials or methods have not been described in detail in order to avoid obscuring the present invention.

Figure 1:
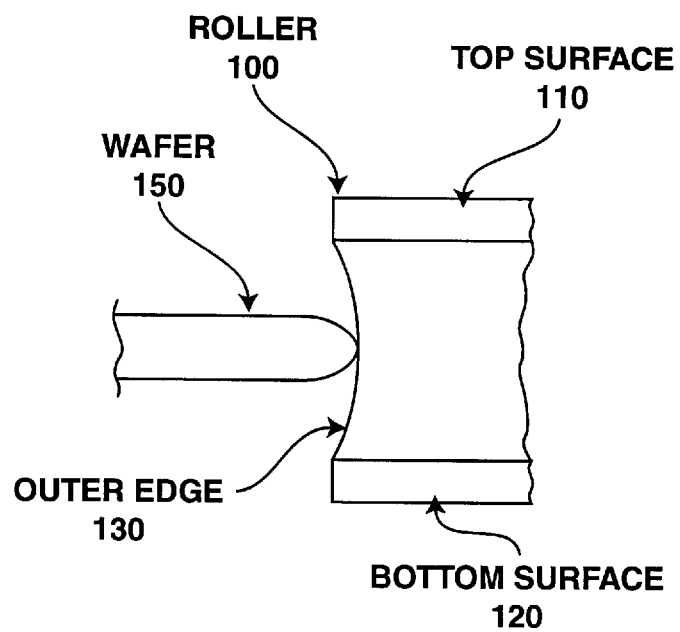
FIG. 1 illustrates a side section view of a prior art roller.
Figure 2:
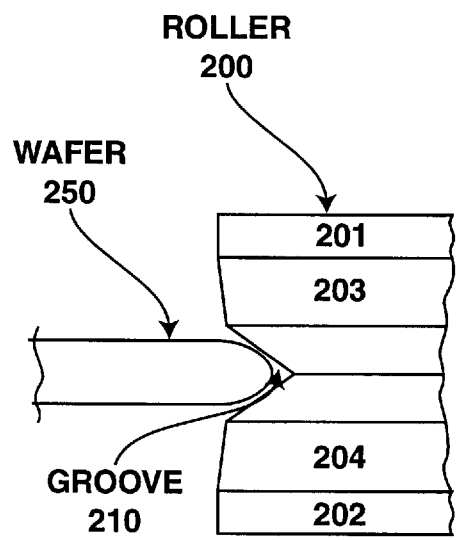
FIG. 2 illustrates a side section view of another prior art roller.
Figure 3A:
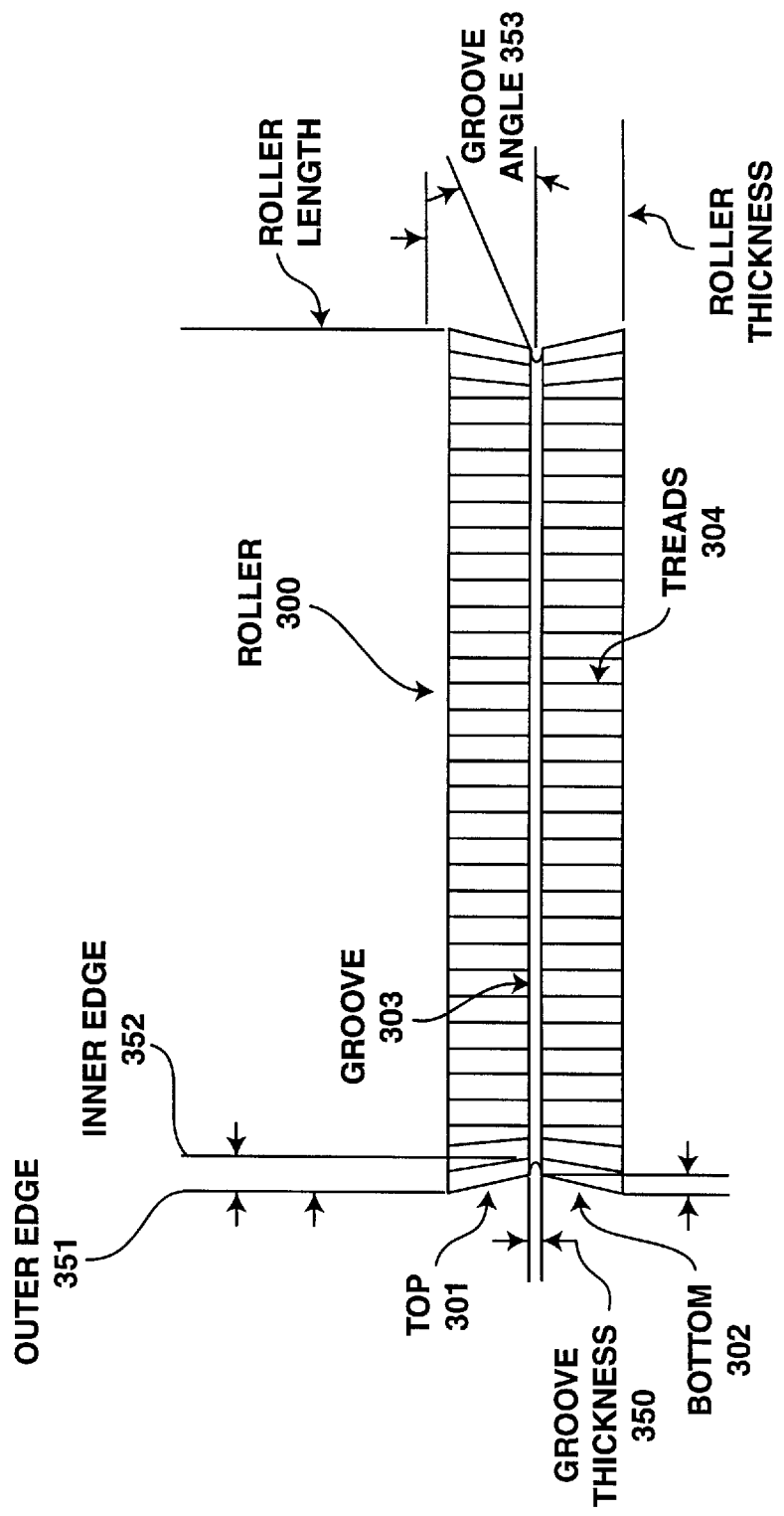
FIG. 3A illustrates a side section view of one embodiment of a roller of the present invention.

FIG. 3A illustrates one embodiment of the roller of the present invention. Referring to FIG. 3A, roller 300 comprises adjacent side portions, the top 301 and the bottom 302, meeting at a groove 303. Top 301 may be symmetrical to the bottom 302. In such a case, the groove 303 resides in the middle of the roller 300. In an alternate embodiment, the groove 303 does not reside in the middle of the roller 300, as the top 301 and the bottom 302 are not symmetrical. In one embodiment, the groove 303 has an opening approximately equal to a thickness of an edge of the substrate. As the roller 300 rotates about a central axis, it imparts rotation motion to the substrate through contact between the substrate and the groove 303.

Treads 304 extend from the groove 303 to outer edges of the roller 300 at the top 301 and bottom 302. The tread also allows better contact between the edge of the roller. The groove and the treads allow the roller to flex so that the roller grips the edge of the wafer. Treads 304 operate to channel solutions away from the groove 303. Note that the term "solutions" is meant to be inclusive and includes all types of liquids, fluids, lubricants, or other non-solid, non-gaseous substances. Such solutions may be typically used as a cleaning solution for the substrate and/or a portion of the roller 300. When the roller 300 rotates, the contact between the substrate and the roller 300 at the groove 303 imparts rotation motion to the substrate. During the rotation, solutions in the groove 303 are channeled away from the groove 303 to the outer edges of the roller 300 from which the solutions are dispersed. By channeling these solutions from the groove 303 during operation, the present invention provides more contact between the roller 300 and a substrate.

In one embodiment, the width of each of the treads is the same as its depth. Also in one embodiment, the width of each tread is substantially constant from the top to the bottom of the roller. Generally, it is more advantageous to have as many treads as possible. However, the material and manufacturing process often dictates how close the treads may be to one another. For example, if the rollers are molded, the number of treads may have to be reduced. Also, the presence of air bubbles may limit the number of treads.

The roller 300 comprises a flexible material. In general, the material of the roller should have a sufficient softness such that the roller pinches the wafer's edge as described herein. In one embodiment, the rollers are molded. The type of molding process may be poured molding, injection molding, or pressure molding. Additionally, the roller of the present invention may be machined. The material should not, however, generate excessive particles in use. Further, the material should have a sufficient memory to retain its shape. In one embodiment, a urethane, for example, 70 Durometer natural urethane, is utilized. This material has been found to have sufficient softness, memory and low particle generation to meet the needs of the present invention. In one embodiment, the material may comprise casted plastic. Note that in one embodiment, any material that holds up to such solutions as HF, $NH_4OH$, DI, etc., may be used.

Figure 3B:
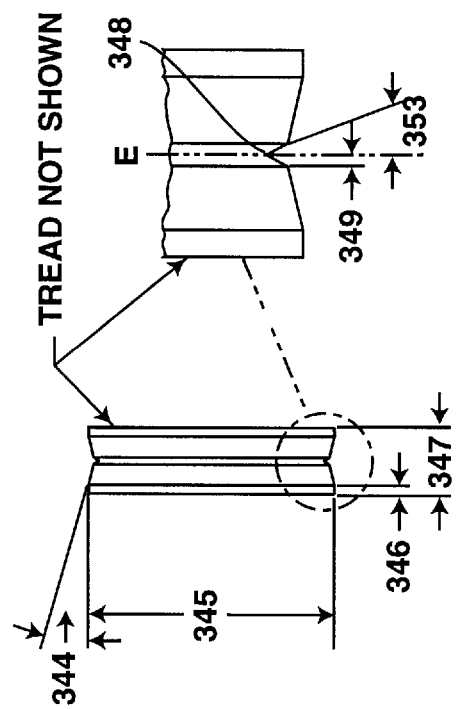
FIG. 3B illustrates one embodiment of the roller of the present invention.
Figure 3B:
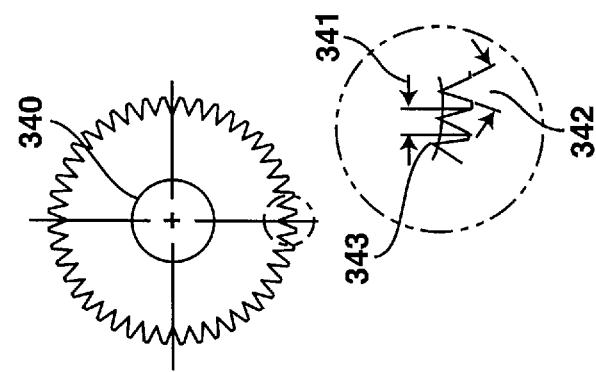

FIG. 3B illustrates one embodiment of the roller of the present invention. Referring to FIG. 3B, the roller may be used with 4.0 inch (100 mm), 5.0 inch (125 mm), 6.0 inch (150 mm) and 8.0 inch (200 mm) wafers. The thickness (347) of the roller is approximately 0.433 inch and its length (345) is approximately 1.625 inches. The surface thickness (346) of both the top and bottom portions is 0.062 inches. The angle (344) at which the roller's diameter extends between the groove and the surface thickness is 15°.

In one embodiment, the thickness of the groove at its outer opening ranges from approximately 0.005–0.040 inch and, in general, is approximately equal to (e.g., within 25% of) the thickness of a wafer. For example, in one embodiment, the groove thickness 350 is tailored to be approximately 0.005 inch greater than the thickness of the wafer. In FIG. 3B, the distance from the center of the groove to the edge of the groove, shown as dimension 349, is 0.020 inches. In FIG. 3B, the radius of curvature (348) for the groove is approximately 0.005. The groove angle 353 at which the sides of the groove slope is approximately 20°.

The roller includes a through hole with diameter (340) of 0.54 inches. Each of the treads have a radius of curvature (343) of 0.005 inches, a width (341) of 0.088 inches, and an angle (342) of 40°.

In one embodiment, the groove pinches the wafer or to some extent conforms to the edge of the wafer. The pinching action does not occur on the upper or lower surface of the wafer. A "V" shape groove may be advantageous since as the edge enters the groove, it contacts the groove at a narrow location of the groove while the surfaces of the wafer are near or within a wider portion of the groove, thus avoiding contact. Although a "V" shaped groove has been illustrated, it will be appreciated that other shapes such as a "U" shaped groove, a substantially square groove, a groove with curved walls, etc., may be used.

The dimensions given above for the roller are merely an example of one embodiment of the present example and are meant simply to illustrate, and not to limit the scope of the present invention. It will be apparent to one of skill in the art that any of these dimensions may vary depending upon the wafer diameter and thickness and may be adjusted to serve the purpose of the present invention.

The roller of the present invention may be incorporated into a substrate processing system having multiple processing stations. For instance, the substrate processing system may comprise a substrate scrubbing system having one or more brush stations for cleaning substrates. When a wet wafer is being cleaned between the brushes in a two-sided scrubber, it is pushed forward and inserted into the groove 303 of roller 300, such that groove 303 pinches the substrate causing increased contact, and therefore, increased friction on roller 300 and the edge of the substrate. Thus, when the roller 300 is rotated the friction causes the substrate to rotate. When solutions, such as cleaning solutions of ammonium hydroxide ($NH_4OH$), water, etc., are used, the treads 304 of the roller 300 channel the solution away improving friction between the roller 300 and the substrate so that there is reduced or no slippage of the substrate.

Although the present invention is described in conjunction with the scrubbing of a wafer, it will be appreciated that any similarly shaped, i.e. generally flat substrate, may be processed by the present invention. Further, it will appreciated that reference to a wafer or substrate may include a bare or pure semiconductor substrate, with or without doping, a semiconductor substrate with epitaxial layers, a semiconductor substrate incorporating one or more device layers at any stage of processing, other types of substrates incorporating one or more semiconductor layers such as substrates having semiconductor on insulator (SOI) devices, or substrates for processing other apparatuses and devices, such as flat panel displays, multichip modules, etc.

Figure 4A:
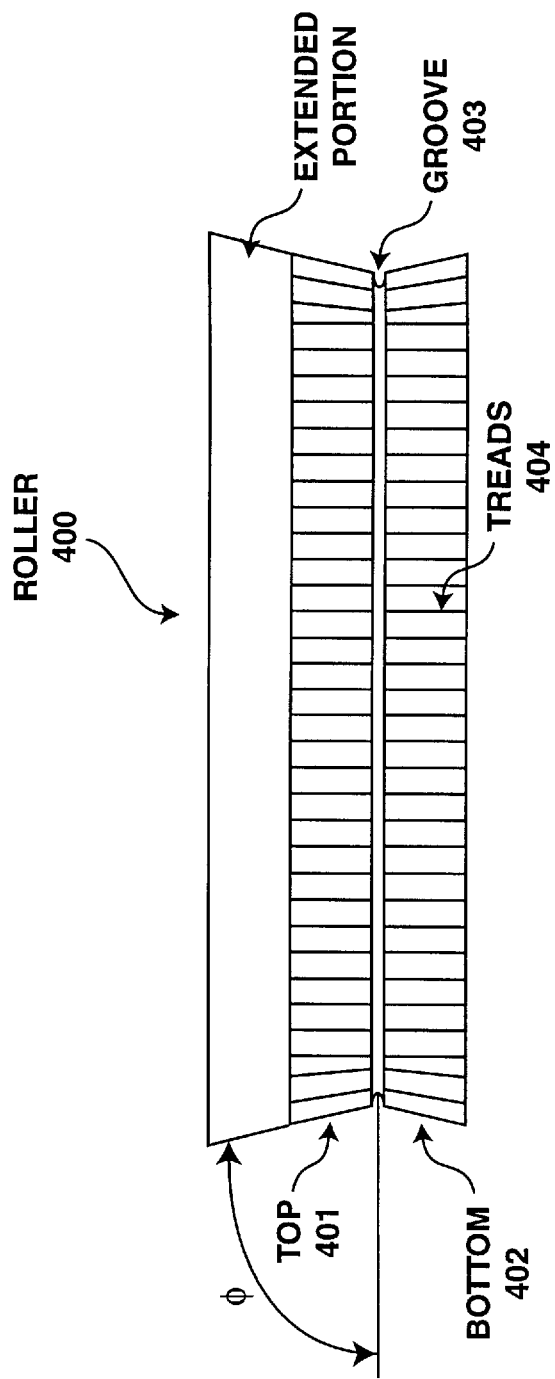
FIG. 4A illustrates a side section view of an alternative embodiment of a roller of the present invention.

FIG. 4A illustrates an alternative embodiment of the roller of the present invention. Referring to FIG. 4A, the roller 400 is very similar to roller 300 (FIG. 3A) with the exception of the top 401 (or the bottom 402) of roller 400 extending beyond that of bottom 402 (or alternatively top 401). In other words, the conic-shaped portions of both top 401 and bottom 402 increase in diameter from the groove 403 to the first outer edge to top 401 and bottom 402; however, the diameter of the conic section at the top 401 is larger than the diameter at the bottom 402. By increasing the size of at least one portion, top 401 and/or bottom 402, of the roller 400, the extended portion may be used to maintain contact between the roller 400 and the substrate when the pressure asserted on the substrate by the two brushes are not aligned vertically. In one embodiment, both the top 401 and bottom 402 are extended to ensure that a substrate remains in contact with and does not escape the inner confines of the roller 400.

The top 401 with the extended portion may be approximately twice the height of bottom 402. In one embodiment, the bottom 402 is 0.216 inches, while top 401 with its extended portion is approximately 0.433 inches, for an overall roller height of 0.649 inches.

The angle Ø for the extended portion as shown in FIG. 4A may be the same as that of the top 401. In one embodiment, the angle Ø is 15°. In an alternative embodiment, the angle Ø for the extended portion is not the same as that of the top. For instance, the angle Ø for the extended portion may be less than that angle Ø between the center line and the top 401.

In regards to the treads 404, they may continue up into and/or through the extended portion or may stop where the extended portion begins. In one embodiment, multiple treads feed a lesser number of longer treads/channels in the extended portion to facilitate the removal of liquids.

Figure 4B:
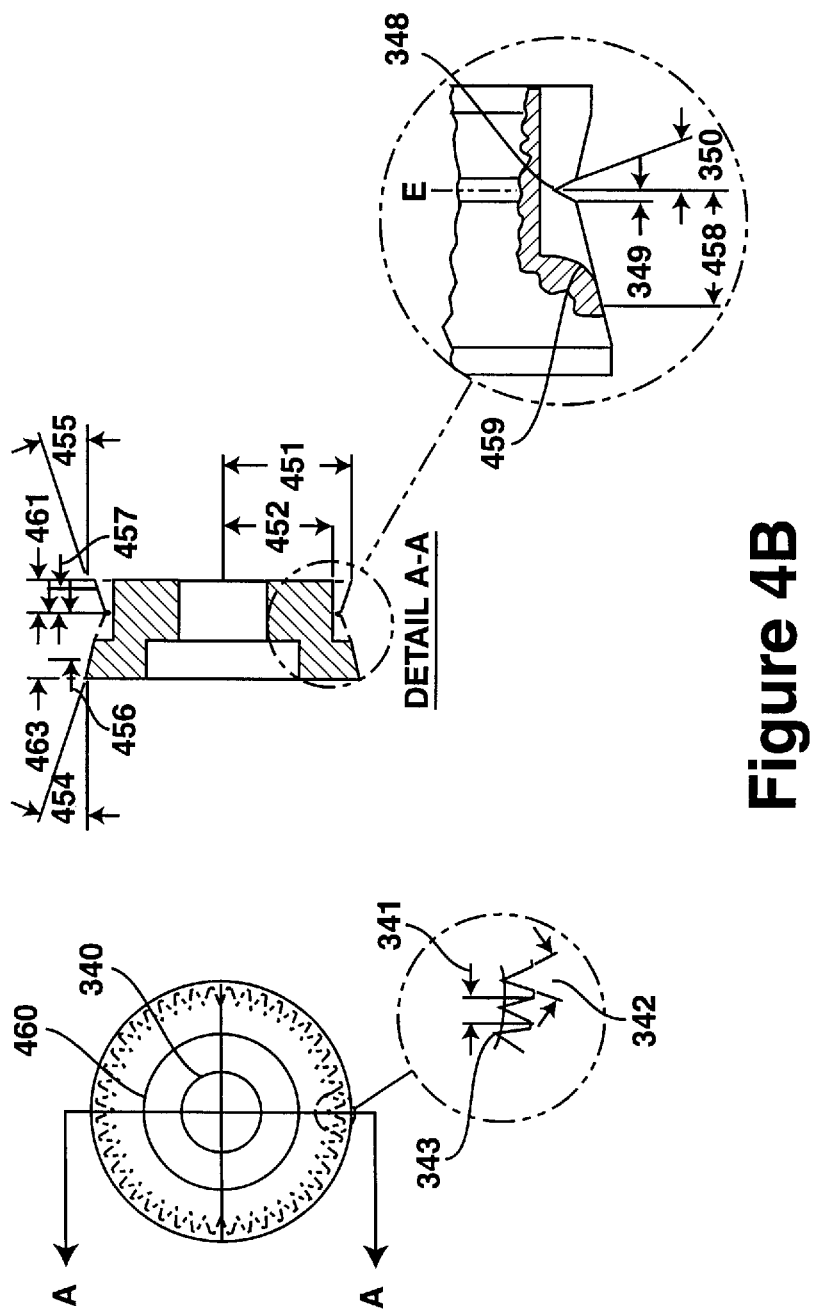
FIG. 4B illustrates one embodiment of the roller of the present invention having an extended portion on one side of the roller.

FIG. 4B illustrates one embodiment of the roller having an extended portion. Referring to FIG. 4B, the roller may be used with 4.0 inch (100 mm), 5.0 inch (125 mm), 6.0 inch (150 mm) and 8.0 inch (200 mm) wafers. The thickness of the roller is approximately 0.634 inches, with the length (461, 463) from the center of the groove to the bottom of the roller being 0.217 inches and to the top of the roller being 0.417 inches. The length (456) from the center of the groove to the beginning of the surface thickness of the top of the roller is 0.355 inches, while the length (457) from the center of the groove to the beginning of the surface thickness of the bottom is 0.154 inches. The length (451) from the center to the edge of one side is approximately 0.813 inches. The length (452) from the center to the deepest part of each tread is approximately 0.703 inches. The angles (484, 455) at which the diameter of the top and bottom extend is approximately 15°.

The groove dimensions are the same as that of FIG. 3B. However, the distance (458) between the center of the groove to a center of radius (459) is 0.255, where the radius (459) is 0.10 inches. The tread dimensions are also the same as those in FIG. 3B. An additional 1.0 inch bore (460) width having a 0.20 inch depth is at the top of the roller.

To enhance particle removal and/or increase more drive friction for the roller, the roller of the present invention may include a pad in the groove to provide cleaning along the edge of the substrate. Note that such a pad has not been shown to avoid obscuring the present invention. The pad may be made of an abrasive (e.g., nylon, PVA, polyurethane, etc.). In one embodiment, the pad comprises a SubaIV pad manufactured by Rodel of Newark, Del. Other abrasive pads such as IC1000, suba500, politex (all manufactured by Rodel) can also be used. Note that the pad can be of different thickness and surface texture to increase and/or even maximize the cleaning action. The pad may also be shaped to remove particles only from an edge, where for instance, the wafer is without bevel areas that cannot be cleaned by the top and bottom brushes. For more information on the pad and its use in cleaning the edge/bevel areas of a substrate, see U.S. patent application Ser. No. 08/640,459, entitled "Method and Apparatus for Cleaning Edges of Contaminated Substrates," filed May 1, 1996, and assigned in-part to the corporate assignee of the present invention.

Figure 5A:
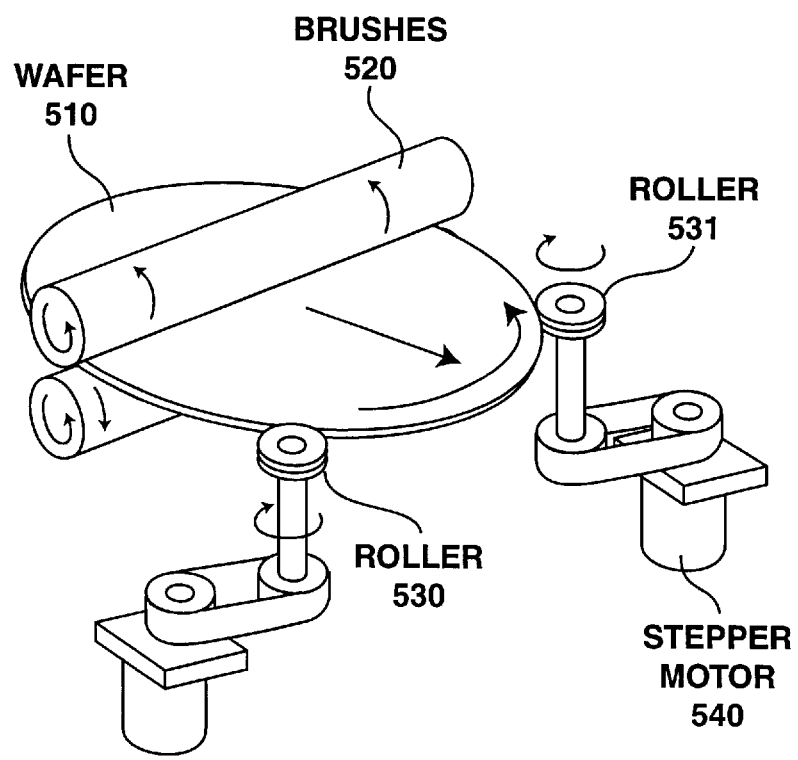
FIG. 5A illustrates one embodiment of the side brush mechanism of the present invention incorporated into one of the rollers.

FIG. 5A illustrates one embodiment of a brush station in a scrubber system. Note that only those portions of the brush station pertinent to the disclosure of the present invention have been shown to avoid obscuring the present invention. Referring to FIG. 5A, wafer 510 is placed between brushes 520 of the double sided scrubber. Motor 540 rotates roller 530 of the present invention. When roller 530 is in contact with wafer 510 friction is created between their edges. Thus, the rotating motion of rollers 530 and 531 and the friction that is created causes wafer 510 to rotate. The rotation of wafer 510 between brushes 520 allows the entire surface of the wafer to be cleaned. The two rollers 530 and 531 contact the wafer at two locations to rotate the wafer and to hold it in place (i.e., prevent forward motion) as it is scrubbed.

Rollers 530 and 531 are positioned by swing arms, which when rotated, cause the rollers to move in an arc towards or away from the wafer.

Water jets may be used to propel water into or near the point of contact between rollers 530 and 531 and the wafer, such as shown in FIG. 5A. Such water jets may be positioned such that the direction of water flows from a plane aligned with the rotational axis of the wafer and contact points between the wafer and the roller. In such a case, the water may simply carry particles away that are removed from the wafer by the cleaning process or may, if at sufficient pressure, cause removal of particles by itself. Note that the water jets are held in place by support structures which are well-known in the art. In one embodiment, the water jets are held in place above the wafer. Such a jet may be as simple as a barbed coupling with reducing barb to increase the velocity of the created stream. In one embodiment, the barbed coupling is ⅛" to 1/16" in diameter. In another embodiment, the jet may include a nozzle that produces a fanned, knife edge pattern. Water jets are well-known in the art. Note also that jets that spray other chemicals may be used, instead of water.

Figure 5B:
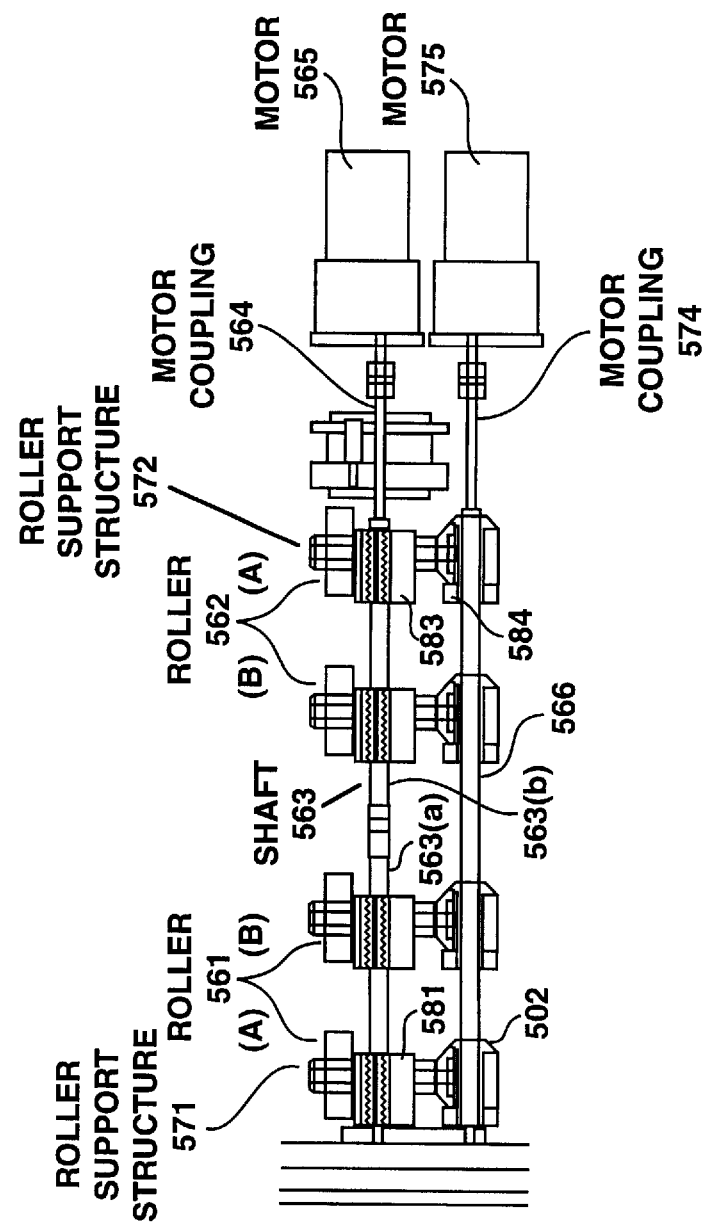
FIG. 5B illustrates one embodiment of a roller position apparatus.

FIG. 5B illustrates an alternative embodiment to move the rollers in position in a scrubber system. Note that only those portions of the brush station pertinent to the disclosure of the present invention have been shown to avoid obscuring the present invention. Referring to FIG. 5B, two rollers 561 and 562 are shown at two different positions (A, B). Position A is at a stowed position, while position B is at a 4 in. wafer position. In one embodiment, the rollers 561 and 562 may be positioned to accommodate wafers of 4, 5, 6, 8 and 12 inches.

Each of rollers 561 and 562 is coupled to roller support structures 571 and 572 respectively, which are coupled to two shafts 563 and 566. In one embodiment, each support structure comprises a tractor described below. Each of support structures 571 and 572 includes an inner member or shaft coupled to its respective roller and rotatably coupled to two shaft attachment mechanisms (shaft attachment mechanisms 581, 582, 583, 584).

Shaft 563 comprises a right-hand threaded shaft 563A and a left-hand threaded shaft 563B coupled in the middle to form a single double helical lead shaft. Shaft 563 is coupled via a motor coupling 564 to a motor 565 which causes the shaft 563 to rotate. Shaft attachment mechanisms 581 and 583 include threads for rotatably coupling to the threads on shafts 563A and 563B respectively. Thus, the present invention uses a treaded drive rod with left and right threads to move rollers into position.

Shaft 566 is coupled to the lower end of each of rollers 561 and 562 in shaft attachment mechanisms 582 and 584, which slide on shaft 566 through the use of bearings. In one embodiment, shaft 563 is a round shaft while shaft 566 is a square-shaped shaft.

When shaft 563 is rotated, the support structures 571 and 572 including the rollers 561 and 562 move along the shaft 563 and slide along shaft 566 which acts as a linear guide to maintain the alignment of rollers 561 and 562 with respect to the wafer. In one embodiment, by rotating the double helical lead screw clockwise, the support structures 571 and 572 and their associated rollers move away from each other. If the lead screws is rotated counter-clockwise, then the support structures and their associated rollers move closer together.

Although shaft 566 maintains the alignment of rollers 561 and 562 with respect to the wafer, shaft 566 is also rotated via motor 575 and motor coupling 574 to impart rotation motion to the rollers. When the rollers come in contact with the wafer, friction is created between their edges. The rotation motion of the rollers and the friction that is created caused the wafer to rotate. This rotation of the wafer between the brushes allows the entire surface of the wafer to be cleaned. The two rollers contact the wafer at two locations to rotate the wafer and to hold it in place (i.e., prevent forward motion) as it is scrubbed. In one embodiment, shaft attachment mechanism 582 and 584 include a set of bevel gears which are coupled between shaft 566 and roller 561 and 562 to impart that rotation motion.

Note that shaft 566 is coupled, in part, to the roller support structures through the use of bearings, which permit support structures to slide along shaft 566 while it is rotating. For more information on this roller position mechanism, see co-pending U.S. application Ser. No. 08/705,162 entitled "Roller Positioning Mechanism" filed concurrently herewith on Aug. 29, 1996, U.S. Pat. No. 5,809,832 and assigned to the corporate assignee of the present invention.

An Exemplary Scrubber

Figure 6:
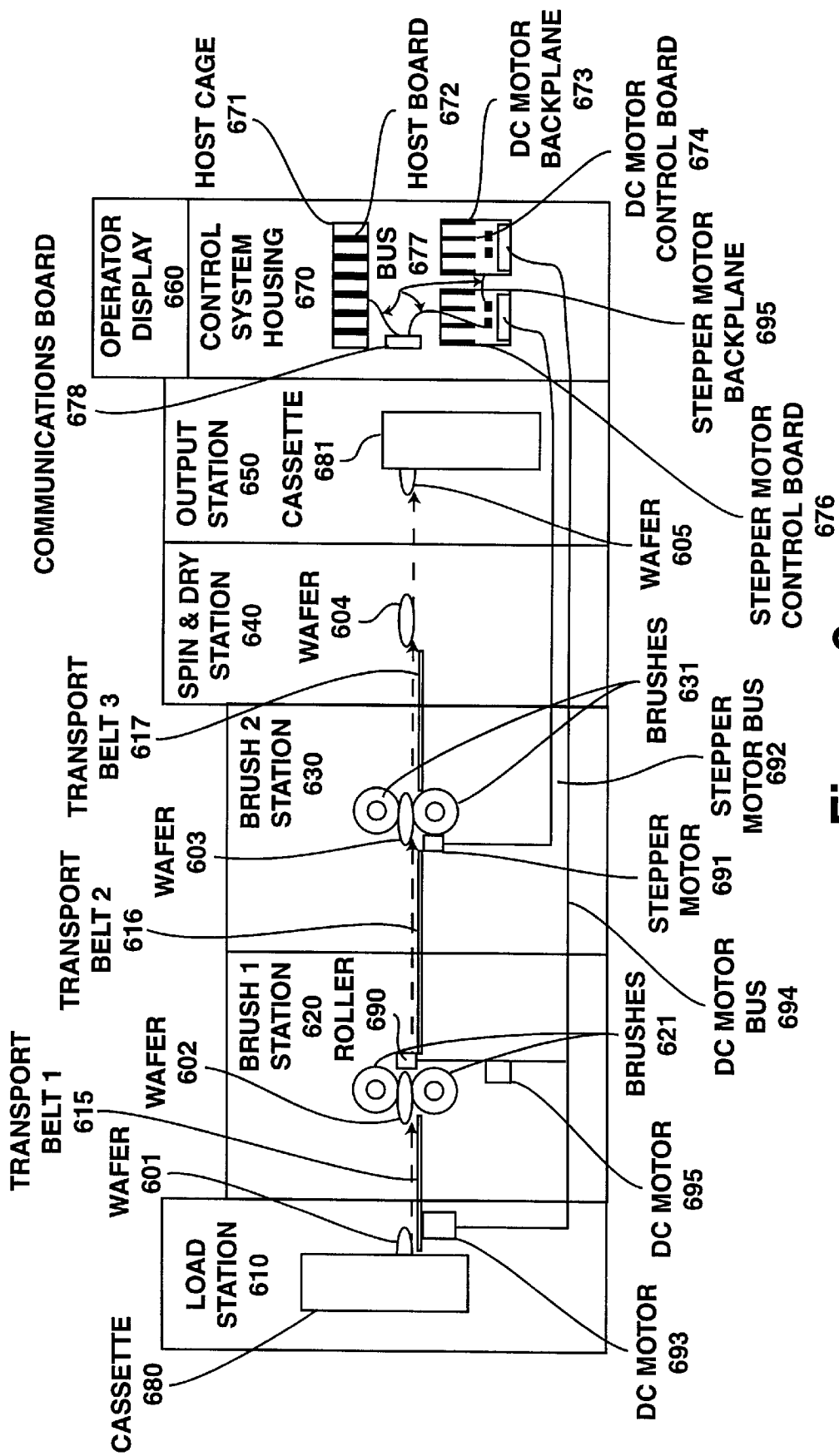
FIG. 6 illustrates one embodiment of the double-sided scrubber system of the present invention.

FIG. 6 illustrates a conceptual view of a double sided wafer scrubber (scrubber) as may be used by one embodiment of the present invention. The scrubber includes a number of stations. Each of these stations logically represent one or more steps in the wafer cleaning process. These stations can also include the hardware and software that completes one of the steps in the cleaning process. The cleaning process includes the steps executed by the scrubber on the wafers. In one embodiment, the scrubber can process multiple wafers simultaneously; one or more wafers are being processed in each of the stations at a point in time.

Dirty wafers are loaded at one end of the scrubber; clean wafers are unloaded from the other end of the scrubber.

In load station 610 (also known as the input station), the operator loads a cassette 680 into the scrubber. The cassette 680 contains a number of dirty wafers. Wafers are automatically moved from load station 610 to brush 1 station 620 on transport belt 1 615. Transport belt 1 615 is moved by DC motor 693. Wafer 601 represents a dirty wafer being automatically removed from cassette 680 and placed on transport belt 1 615.

In brush 1 station 620, a dirty wafer 602, is brushed and sprayed (water jets not shown), to remove some of the particles from the dirty wafer 602. Brushes 621 scrub both sides of the dirty wafer 602. The height of the top brush is controlled by a stepper motor (not shown). Roller 690 rotates dirty wafer 602 and may act as a side brush. The once brushed wafers are then automatically moved to brush 2 station 630. This is done by transport belt 2 616, controlled by a second DC motor (not shown).

In brush 2 station 630, a once brushed wafer 603 is brushed and sprayed (water jets not shown), to remove more of the particles from the once brushed wafer 603. Brushes 631 scrub both sides of the once brushed wafer 603. The height of the top brush of brushes 631 are controlled by stepper motor 691. Although not shown, brush 2 station 630 may also include a side brush, like roller/side brush 690, to clean the edge and bevel area of once brushed wafer 603. The twice brushed wafers are then automatically moved to spin & dry station 640, via transport belt 3 617.

Spin & dry station 640 rinses the wafers, spins them, and dries them. Wafer 604 represents a wafer being processed in the spin & dry station 640. At this point, the wafer has been cleaned. Note, for one particular type of wafer, the wafer must have been kept wet during the load station 610, brush 1 station 620, and brush 2 station 630. Only after being brushed and rinsed can this type of wafer then be spun and dried. The spun and dried wafer is then moved to the output station 650.

In output station 650, the clean wafer is put into a cassette 681. Wafer 605 represents a clean wafer being put into cassette 681. The cassette 681, when full of clean wafers, can then be removed by the operator. This completes the cleaning process.

Control system housing 670 houses a number of components that comprise the heart of the control system for the scrubber. Control system housing 670 includes a host cage 671 having a host board 672. The host board 672 provides the overall control for the scrubber. The host board 672 typically includes one or more host processors implemented in one or more physical packages. The host cage 671 provides support for the host board 672 and other boards in the host cage (e.g. sensor input boards, a video card for operator display 660, a board for communicating signals from the host board 672 to the rest of the control system).

The host board can communicate to the rest of the control boards through another board in the host cage 671 (communication board 678) or through a connector directly to the host board 672. A control board is typically a modular circuit formed on a printed circuit board, that controls motors or other devices within a scrubber. Typically, communications from the host cage pass through a communications board 678. The communications board, in turn, communicates with other devices through a bus 677.

Bus 677 supports an easily extensible and modular control system. In the scrubber of FIG. 6, the bus 677 links the host board 672, the communications board 678, the stepper motor backplane 695 and the DC motor backplane 673. Messages between the various devices attached to the bus 677 can be communicated according to a protocol described below. A message is a packet of information to be communicated from one point to another point.

The stepper motor backplane 695 supports a stepper motor control board 676. This stepper motor control board 676 controls the movement of stepper motor 691 via stepper motor bus 692. Similarly, the DC motor backplane 673 supports a DC motor control board 674. The DC motor control board 674 controls the movement of the DC motor 693 and DC motor 695 via DC motor bus 694.

In one embodiment of the present invention, each of these backplanes support up to four motor control boards. However, one of ordinary skill in the art would understand that the present invention is not limited to backplanes that support only four motor control boards.

Operator display 660 typically includes a monitor like a cathode ray tube, or flat panel display. In one embodiment, operator display 660 also includes a touch sensitive screen allowing the operator to interact with the scrubber control system.

Note that FIG. 6 is a conceptual drawing. Some components are represented by one symbol so as to not overly obscure the present invention. For example, it is possible to have transport belt 3 617 be made of two or more physical transport belts, each belt being moved by a different DC motor.

Whereas many alterations and modifications of the present invention will no doubt become apparent to a person of ordinary skill in the art after having read the foregoing description, it is to be understood that the various embodiments shown and described by way of illustration are in no way intended to be considered limiting. Therefore, references to details of various embodiments are not intended to limit the scope of the claims which in themselves recite only those features regarded as essential to the invention.

We claim:

1. A system for processing a substrate comprising:
    a first wafer processing station; and
    a second wafer processing station coupled to the first station, wherein at least one of the first and second wafer processing stations comprises a roller to rotate the substrate, the roller having
        a groove;
        a first outer edge;
        at least one tread extending between the groove and the first outer edge.

2. The system defined in claim 1 further comprising a solution dispenser, coupled to the at least one of the first and second wafer processing stations, to dispense a solution onto the wafer, wherein the at least one tread comprises a plurality of treads to channel the solution away from the groove.

3. The system defined in claim 1 wherein the roller further comprises:
    a second outer edge;
    at least one tread extending between the groove and the second outer edge.

4. The system defined in claim 3 wherein the at least one tread extending to the first outer edge rotates about a central axis and is conic shaped having an increasing diameter from the groove to the first outer edge, and the at least one tread extending to the second outer edge rotates about a central axis and is conic shaped having an increasing diameter from the groove to the second outer edge.

5. The system defined in claim 4 wherein the diameter at the first outer edge is greater than the diameter at the second outer edge.

6. The system defined in claim 1 wherein the roller rotates about a central axis and imparts rotation motion to the substrate through contact between the substrate and the groove.

7. The system defined in claim 1 wherein the first and second stations comprises first and second brush stations.

8. The system defined in claim 1 wherein the roller comprises a flexible material.

9. The system defined in claim 1 wherein the groove has an opening approximately equal to a thickness of an edge of the substrate.

10. The system defined in claim 1 wherein each of the first and second wafer processing stations comprises a brush station to clean the wafer.

11. A system for cleaning semiconducting wafers comprising:
    a first wafer processing station; and
    a second wafer processing station coupled to the first wafer processing station, wherein at least one of the first and second wafer processing stations comprises a roller to rotate the wafer, the roller having
        a groove;
        a first outer edge;
        a first tread, having a width and a depth, extending between the groove and the first outer edge;
        an extended edge;
        an extended portion extending between the first outer edge and the extended edge.

12. The system defined in claim 11 wherein the groove is "v" shaped having
    a first groove side;
    a second groove side intersecting the first groove side and forming a groove angle with a vertex located at the intersection of the first and second groove sides.

13. The system defined in claim 12 wherein the groove angle is equal to 20 degrees.

14. The system defined in claim 11 wherein a width of the first tread is substantially equal to a depth of the first tread.

15. The system defined in claim 14 wherein the width of the first tread is substantially constant from the groove to the first outer edge of the roller.

16. The system defined in claim 15 wherein a second tread extends from the first outer edge of the roller to the extended edge of the roller and the second tread is longer than the first tread.

17. The system defined in claim 11 further comprising a solution dispenser, coupled to the at least one of the first and second wafer processing stations, to dispense a solution onto the wafer, wherein the first one tread comprises a plurality of treads to channel the solution away from the groove.

18. The system defined in claim 11 wherein each of the first and second wafer processing stations comprises a brush station to clean the wafer.

* * * * *